(12) United States Patent
Hsu et al.

(10) Patent No.: US 11,784,148 B2
(45) Date of Patent: Oct. 10, 2023

(54) SEMICONDUCTOR PACKAGE

(71) Applicant: Taiwan Semiconductor Manufacturing Company, Ltd., Hsinchu (TW)

(72) Inventors: Chia-Kuei Hsu, Hsinchu (TW); Ming-Chih Yew, Hsinchu (TW); Po-Hao Tsai, Taoyuan (TW); Po-Yao Lin, Hsinchu County (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/699,196

(22) Filed: Mar. 21, 2022

(65) Prior Publication Data

US 2022/0208707 A1 Jun. 30, 2022

Related U.S. Application Data

(60) Continuation of application No. 17/106,164, filed on Nov. 29, 2020, now Pat. No. 11,282,803, which is a continuation of application No. 16/880,928, filed on May 21, 2020, now Pat. No. 10,854,563, which is a division of application No. 16/129,736, filed on Sep. 12, 2018, now Pat. No. 10,665,559.

(60) Provisional application No. 62/655,827, filed on Apr. 11, 2018.

(51) Int. Cl.
*H01L 23/00* (2006.01)
*H01L 23/31* (2006.01)
*H01L 21/56* (2006.01)
*H01L 21/768* (2006.01)

(52) U.S. Cl.
CPC .............. *H01L 24/09* (2013.01); *H01L 21/56* (2013.01); *H01L 21/76816* (2013.01); *H01L 23/3107* (2013.01); *H01L 24/17* (2013.01); *H01L 24/33* (2013.01); *H01L 2224/02379* (2013.01); *H01L 2924/35121* (2013.01)

(58) Field of Classification Search
CPC ..... H01L 23/3107; H01L 24/09; H01L 24/17; H01L 24/33
See application file for complete search history.

(56) References Cited

U.S. PATENT DOCUMENTS

| | | | |
|---|---|---|---|
| 2013/0062761 A1* | 3/2013 | Lin | H01L 21/565 257/737 |
| 2014/0077356 A1* | 3/2014 | Chen | H01L 23/5226 257/737 |
| 2015/0287685 A1* | 10/2015 | Sarihan | H01L 24/03 257/774 |
| 2019/0139784 A1* | 5/2019 | Lin | H01L 21/4846 |

* cited by examiner

*Primary Examiner* — Peniel M Gumedzoe
(74) *Attorney, Agent, or Firm* — JCIPRNET

(57) ABSTRACT

A redistribution structure includes a first dielectric layer, a pad pattern, and a second dielectric layer. The pad pattern is disposed on the first dielectric layer and includes a pad portion and a peripheral portion. The pad portion is embedded in the first dielectric layer, wherein a lower surface of the pad portion is substantially coplanar with a lower surface of the first dielectric layer. The peripheral portion surrounds the pad portion. The second dielectric layer is disposed on the pad pattern and includes a plurality of extending portions extending through the peripheral portion.

20 Claims, 10 Drawing Sheets

SEMICONDUCTOR PACKAGE

CROSS-REFERENCE TO RELATED APPLICATION

This is a continuation application of and claims the priority benefit of U.S. application Ser. No. 17/106,164, filed on Nov. 29, 2020, now allowed. The U.S. application Ser. No. 17/106,164 is a continuation application of and claims the priority benefit of U.S. application Ser. No. 16/880,928, filed on May 21, 2020, U.S. Pat. No. 10,854,563, issued on Dec. 1, 2020. The U.S. application Ser. No. 16/880,928 is a divisional application of U.S. application Ser. No. 16/129,736, filed on Sep. 12, 2018 U.S. Pat. No. 10,665,559 B2, issued on May 26, 2020. The U.S. application Ser. No. 16/129,736 claims the priority benefit of U.S. provisional application Ser. No. 62/655,827, filed on Apr. 11, 2018 and is now allowed. The entirety of each of the above-mentioned patent applications is hereby incorporated by reference herein and made a part of this specification.

BACKGROUND

Generally, a semiconductor die may be connected to other devices external to the semiconductor die through a type of packaging utilizing solder bumps. The solder bumps may be formed by initially forming a layer of under bump metallization in contact with a conductive portion of the semiconductor die and then placing a conductive feature and solder onto the under bump metallization. A reflow operation may then be performed in order to shape the solder into the desired shape. The solder may then be placed into physical contact with the external device and another reflow operation may be performed in order to bond the solder with the external device. In such a fashion, a physical and electrical connection may be made between the semiconductor die and an external device, such as a printed circuit board, another semiconductor die, or the like.

Different materials, such as dielectric materials, metallization materials, etch stop materials, barrier layer materials, and other materials utilized in the formation of the semiconductor die may each have a unique coefficient of thermal expansion that is different from the other materials. This type of coefficient of thermal expansion mismatch causes each one of the materials to expand differently when the semiconductor die is heated during later processing, testing or use. As such, at elevated temperatures there is a coefficient of thermal expansion mismatch that causes stresses to form between the different materials and, hence, the different parts of the semiconductor die. These stresses can cause delamination to occur between the various layers of material. This delamination can damage the semiconductor die during the manufacturing process or else during its intended use.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
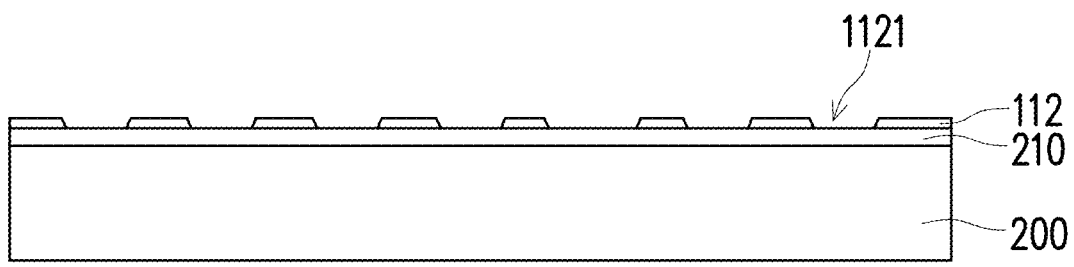
FIG. 1 to FIG. 10 illustrate cross sectional views of intermediate stages in the manufacturing of a semiconductor package structure according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

FIG. 1 to FIG. 10 illustrate cross sectional views of intermediate stages in the manufacturing of a semiconductor package structure according to some exemplary embodiments of the present disclosure.

It is noted that the present disclosure will be described with respect to some embodiments in a specific context, namely an integrated fan-out package structure and manufacturing method thereof. The concepts in the disclosure may also apply, however, to other semiconductor packages or circuits. A device (e.g. redistribution structure) applicable for a semiconductor package, a semiconductor package structure and the method of forming the semiconductor package are provided in accordance with various embodiments. The intermediate stages of forming the semiconductor package are illustrated in accordance with some embodiments. The variations of the embodiments are discussed. Throughout the various views and illustrative embodiments, like reference numbers are used to designate like elements.

In some embodiments, the intermediate stages of forming the semiconductor package (e.g. the semiconductor package 100 shown in FIG. 10) are described as follows. With reference to FIG. 1, a carrier 200 is provided, and an adhesive layer 210 may be disposed on the carrier 200. In some embodiments, the carrier 200 may include, for example, silicon based materials, such as glass, ceramics or silicon oxide, or other materials, such as aluminum oxide, combinations of any of these materials, or the like. The carrier 200 is planar in order to accommodate attachment of semiconductor devices such as a semiconductor device 120 (not illustrated in FIG. 1 but illustrated and discussed below with respect to FIG. 5B and FIG. 7). The adhesive layer 210 may be placed on the carrier 200 in order to assist in the adherence of overlying structures (e.g. the redistribution structure 110). In an embodiment the adhesive layer 210 may include an ultra-violet glue, which reduces or loses its adhesive properties when exposed to ultra-violet light. However, other types of adhesives, such as pressure sensitive adhesives, radiation curable adhesives, light to heat conversion release coating (LTHC), epoxies, combinations of these, or the like, may also be used. The adhesive layer 210 may be placed onto the carrier 200 in a semi-liquid or gel form, which is readily deformable under pressure.

Figure 5:
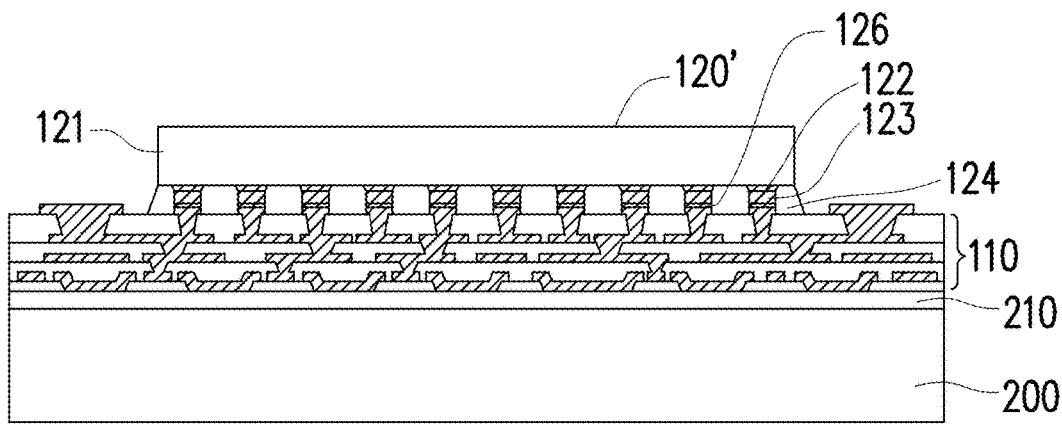

In some embodiments, a redistribution structure (e.g. the redistribution structure 110 as shown in FIG. 5) may be formed on the carrier 200, or on the adhesive layer 210 (if any). The formation of the redistribution structure 110 may include the following steps. With reference now to FIG. 1, the redistribution structure 110 may be formed by initially forming a first dielectric layer 112 on the carrier 200, or on the adhesive layer 210 (if any). In an embodiment, the first dielectric layer 112 may be polybenzoxazole (PBO), although any suitable material, such as polyimide or a polyimide derivative, may alternatively be utilized. The first dielectric layer 112 may be placed using, e.g., a spin-coating process, although any suitable method and thickness may alternatively be used. In some embodiments, the first dielectric layer 112 includes a pad opening 1121. The pad opening 1121 may be made through the first dielectric layer 112 by removing portions of the first dielectric layer 112 to expose at least a portion of the underlying carrier 200, or adhesive layer 210 (if any). In some embodiments, the pad opening 1121 may be formed using a suitable photolithographic mask and etching process, although any suitable process may be used.

Figure 2:
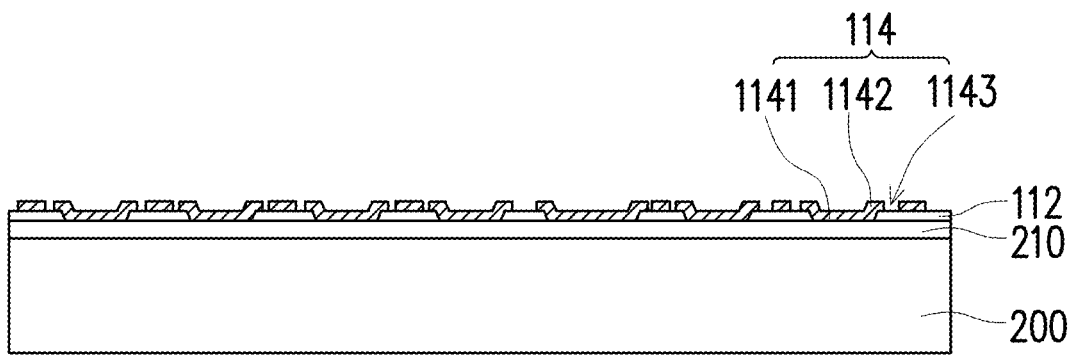

With reference to FIG. 2, a pad pattern 114 is formed on the first dielectric layer 112. In some embodiments, the pad pattern 114 is embedded in the pad opening 1121 of the first dielectric layer 112. In other words, the pad pattern 114 extends into the pad opening 1121 and includes a plurality of holes 1143 extending through the pad pattern 114. In some embodiments, the holes 1143 may be arranged in a mesh form (e.g. mesh holes). In some embodiments, the pad pattern 114 may be one of the patterns of a redistribution circuit layer formed on the first dielectric layer 112, and the redistribution circuit layer may include more than one pad patterns 114. In an embodiment in which the redistribution circuit layer is formed using a seed layer, a patterned photoresist, and a plating process, the holes 1143 may be formed by simply not removing the photoresist in those areas where the holes 1143 are desired. In this way, the holes 1143 within the pad pattern 114 are formed along with the rest of the redistribution circuit layer, and no additional processing is utilized.

For example, the pad pattern 114 may be formed by initially forming a seed layer (not shown) through a suitable formation process such as CVD or sputtering. In some embodiments, the seed layer may include Cu, Ti/Cu, TiW/Cu, Ti, CrCu, Ni, Pd or the like, and may be deposited over the first dielectric layer 112 by, e.g. sputtering. A photoresist (also not shown) may be formed to cover a part of the metal layer 114, and the photoresist may then be patterned to expose those portions of the metal layer 114 where at least one pad portion 1141 and a peripheral portion 1142 are desired to be located. Once the photoresist has been formed and patterned, a conductive material, such as copper, may be formed on the seed layer through a deposition process such as plating. However, while the material and methods discussed are suitable to form the conductive material, these materials are merely exemplary. Any other suitable materials, such as AlCu or Au, and any other suitable processes of formation, such as CVD or PVD, may alternatively be used to form the pad pattern 114. Once the conductive material has been formed, the patterned photoresist may be removed through a suitable removal process such as ashing. Additionally, after the removal of the patterned photoresist, those portions of the seed layer that were covered by the patterned photoresist may be removed through, for example, a suitable etch process using the conductive material as a mask. However, the process described above is merely for illustration. Any suitable process to form the pad pattern 114 may be used.

In another embodiment, the pad pattern 114 on the first dielectric layer 112 may be formed as a solid material and the holes 1143 may be formed after the formation of the remainder of the pad pattern 114. In this embodiment, a photolithographic masking and etching process may be utilized, whereby a photoresist is placed and patterned over the pad pattern 114 after the pad pattern 114 has been formed, and one or more etching processes is utilized to remove those portions of pad pattern 114 where the holes 1143 are desired. Any suitable process may be utilized to form the holes 1143.

Figure 11:
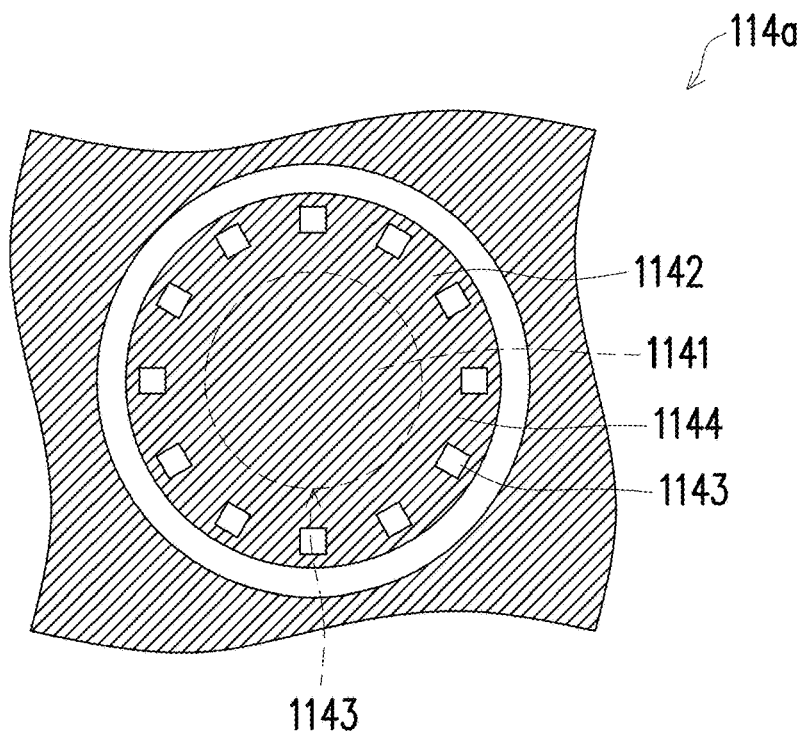
FIG. 11 illustrates a top view of a pad pattern of a semiconductor package according to some exemplary embodiments of the present disclosure.
Figure 12:
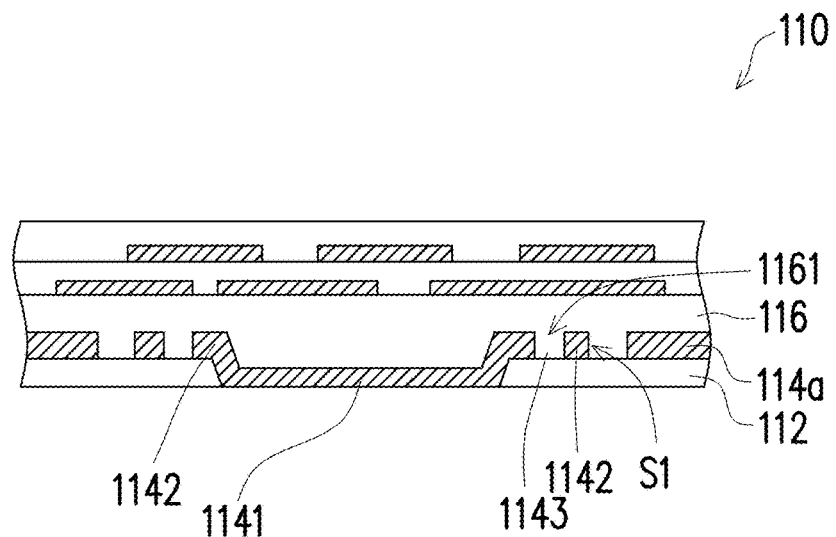
FIG. 12 illustrates a cross sectional view of a part of a redistribution structure of a semiconductor package according to some exemplary embodiments of the present disclosure.

FIG. 11 illustrates a top view of a pad pattern of a semiconductor package according to some exemplary embodiments of the present disclosure. FIG. 12 illustrates a cross sectional view of a part of a redistribution structure of a semiconductor package according to some exemplary embodiments of the present disclosure. With reference now to FIG. 2 in view of FIG. 11 and FIG. 12, in some embodiments, the holes 1143 surround (e.g. encircle) the pad opening 1121 (shown in FIG. 1) to define a pad portion 1141 and a peripheral portion 1142. The pad portion 1141 extends into the pad opening 1121, and the peripheral portion 1142 surrounds the pad portion 1141. In some embodiments, the holes 1143 are disposed on the peripheral portion 1142 and extend through the peripheral portion 1142 as it is shown in FIG. 11 and FIG. 12. Accordingly, the pad portion 1141 is located at the pad opening 1121, and a lower surface of the pad portion 1141 is substantially coplanar with a lower surface of the first dielectric layer 112 since the pad portion 1141 and the first dielectric layer 112 are both formed on the carrier 200 or on the adhesive layer 210 (if any) with a planar top surface.

Figure 3:
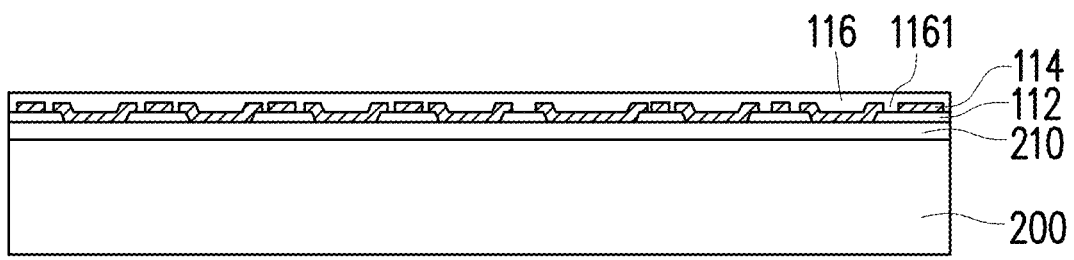

With reference to FIG. 3, a second dielectric layer 116 is formed on the pad pattern 114, and the second dielectric layer 116 fills the holes 1143 to form a plurality of dielectric plugs 1161 extending through the pad pattern 114. That is, the second dielectric layer 116 includes a plurality of extending portions 1161 (i.e. the dielectric plugs 1161) extending through the peripheral portion 1142. In other words, the holes 1143 are filled with the dielectric material of the second dielectric layer 116. In some embodiments, the dielectric plugs 1161 surround the pad opening 1121 and extend through the peripheral portion 1142. In some embodiments, the peripheral portion 1142 is disposed on an upper surface of the first dielectric layer 112. The pad portion 1141 is connected to the peripheral portion 1142, and extends from the upper surface of the first dielectric layer 112 to the lower surface of the first dielectric layer 112. In some embodiments, the pad portion 1141 and the peripheral portion 1142 are integrally formed. Namely, the pad portion 1141 is directly connected to and the peripheral portion 1142 without a borderline in between.

With such arrangement, the pad pattern 114 is manufactured with the holes 1143 through the peripheral portion 1142 in order to reduce high sidewall peeling stresses and cracks that may otherwise accumulate along the sidewalls (e.g. the sidewalls S1 shown in FIG. 12) of the pad pattern 114 during thermal cycle tests, further processing, or operation. In other words, by forming the pad portion 114 with the holes 1143 (i.e. the dielectric plugs 1161/the extending portions), the pad portion 114 is better able to withstand the stresses that are involved with the semiconductor manufacturing, testing, and operating processes. In addition, the holes 1143 may be utilized to reduce or eliminate delamination or peeling that may occur along the sidewalls of the pad portion 114. Such reduction or prevention of delamination and peeling will help prevent defects and increase the overall yield of a manufacturing process of a semiconductor package (e.g. semiconductor package 100). It is noted that the arrangement of the pad pattern 114 with the holes 1143 may also applied to any other layers of the redistribution structure 110.

In some embodiments, a sum of layout areas of the holes 1143 may also be substantially about 3%~about 60% of a sum of layout areas of the pad portion 1141 and the peripheral portion 1142. Herein, the term "layout area" is referred to the area occupied by the structure concerned (e.g. the holes 1143, the pad portion 1141 and/or the peripheral portion 1142) from a top view, like the top views shown in FIG. 11, FIG. 14, FIG. 16, and FIG. 20, for example. For the hole 1143, the term "layout area" may be a cross sectional area of the hole 1143. In some embodiments, since the thicknesses of the holes 1143 and the pad pattern 114 are substantially the same or at least similar, a sum of volumes of the holes 1143 is substantially 3%~60% of a sum of volumes of the pad portion 1141 and the peripheral portion 1142. Under such proportion, the holes 1143 are capable of reducing high sidewall peeling stresses of the pad pattern 114, and increasing contact area between the pad pattern 114 and the dielectric layers 112, 114, which reduces risk of delamination of the pad pattern 114. In some embodiments, each of the holes 1143 (i.e. the dielectric plugs 1161/the extending portions) can be in a square, rectangle, circle, ellipse, triangle or irregular shape. Any suitable shapes may be utilized to reduce sidewall peeling stress of the pad pattern 114.

In one embodiment, the pad opening 1121 is in a circular shape. In such embodiment, the holes 1143 may be arranged as portions of a discontinuous circle located adjacent to the outer circumference (e.g. the peripheral portion 1142) of the pad pattern 114. In addition, in order to make sure that the peripheral portion 1142 remains physically and electrically connected to the pad portion 1141, a connecting portion 1144 of the peripheral portion 1142 separates the holes 1143 from each other.

Figure 4:
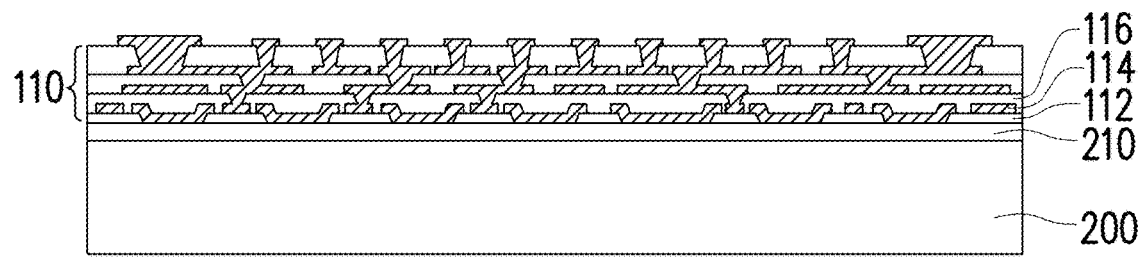

With reference now to FIG. 4, after the second dielectric layer 116 is formed, one or more redistribution circuit layers and one or more dielectric layers may be formed alternately on the carrier 200 to form the redistribution structure 110 on the carrier 200. In some embodiments, the redistribution structure 110 may be formed by continuingly depositing conductive layers, patterning the conductive layers to form redistribution circuits, partially covering the redistribution circuits and filling the gaps between the redistribution circuits with dielectric layers, etc. The material of the redistribution circuits (including the pad pattern 114) may include a metal or a metal alloy including aluminum, copper, tungsten, and/or alloys thereof. The dielectric layers (including dielectric layers 112, 116) may be formed of dielectric materials such as oxides, nitrides, carbides, carbon nitrides, combinations thereof, and/or multi-layers thereof. However, number of the dielectric layers and number of the redistribution circuit layers are not limited in the disclosure.

Figure 5A:
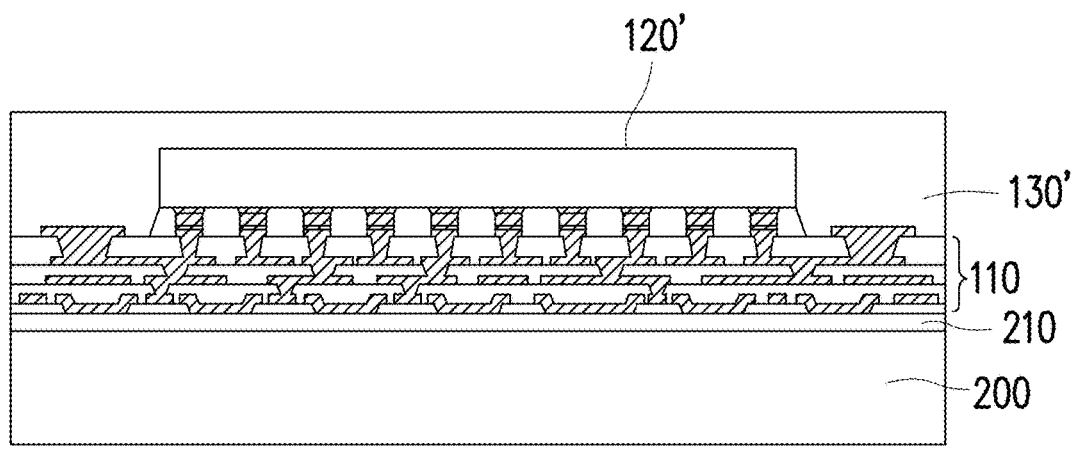
Figure 5B:
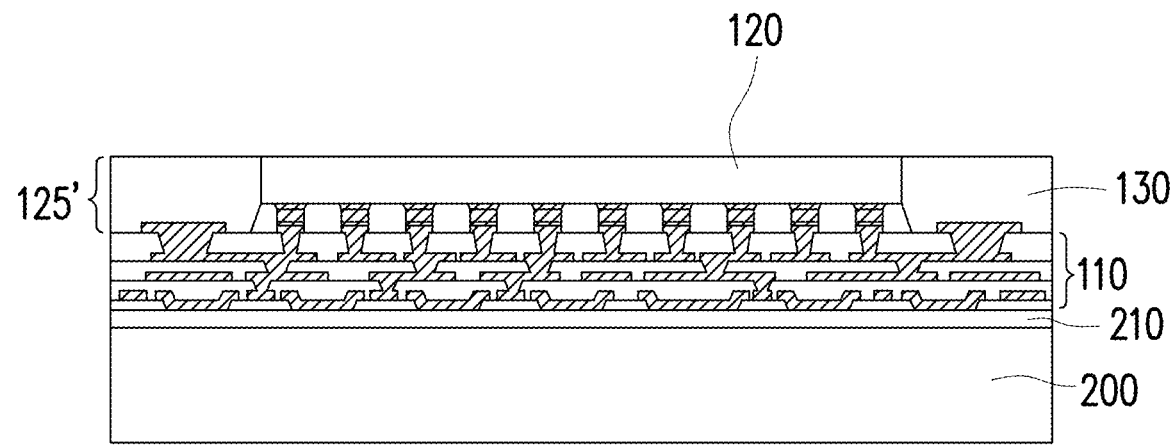
Figure 6:
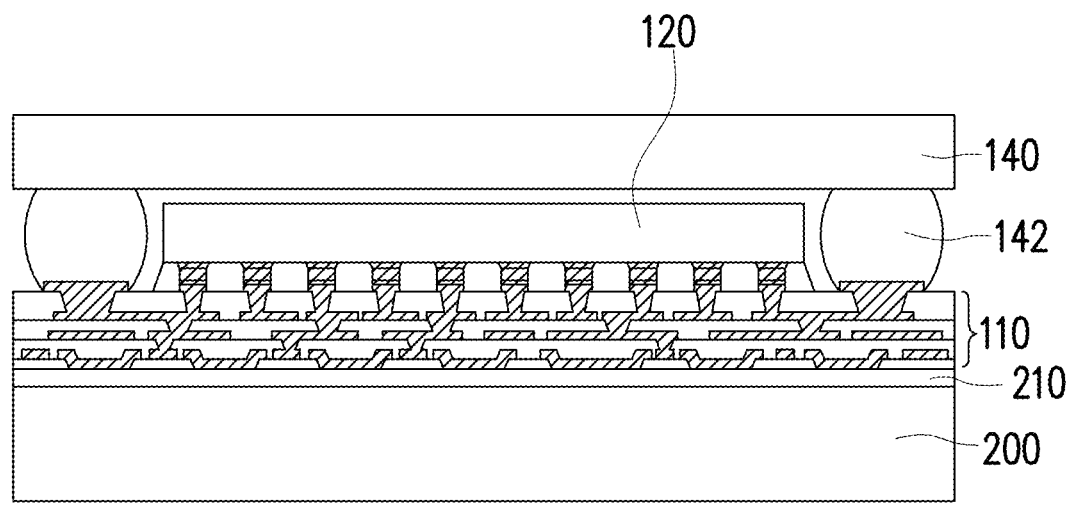
Figure 7:
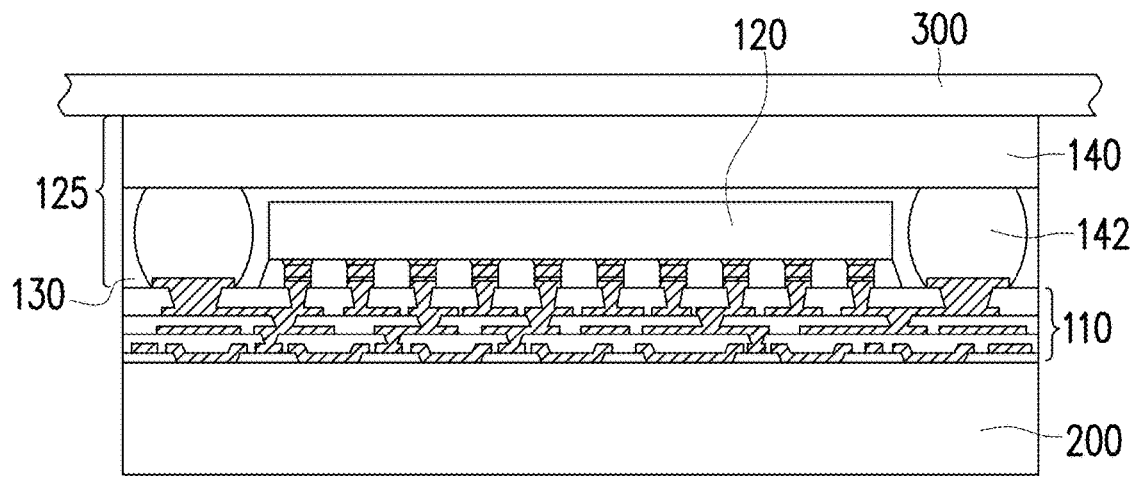

In some embodiments, an encapsulated semiconductor device (e.g. the encapsulated semiconductor device 125' as shown in FIG. 5B or the encapsulated semiconductor device 125 as shown in FIG. 7) may be formed on the carrier 200. In some embodiments, the encapsulated semiconductor device 125'/125 may be a reconstructed wafer including a plurality of semiconductor devices 120 encapsulated by an encapsulating material 130. With such arrangement, a plurality of semiconductor packages can be formed concurrently for batch production. For the sake of brevity and clarity, the manufacturing process of one of the semiconductor packages (e.g. the semiconductor package 100) is illustrated in FIG. 1 to FIG. 10. For example, one of the semiconductor devices 120 disposed on the redistribution structure 110 is illustrated in FIG. 5. The formation of the encapsulated semiconductor device 125'/125 may be described as follows.

Optionally, a plurality of through vias (not shown) may be provided on the carrier 200, and the through vias may surround at least one device area where the semiconductor devices 120/120' to be disposed. In the present embodiment, the through vias are formed on and electrically connected to the redistribution structure 110 located on the carrier 200, but the disclosure is not limited thereto. In other embodiments, the through vias may be pre-formed, and are then placed on the carrier 200.

With reference now to FIG. 5, in some embodiments, at least one semiconductor device 120' (one semiconductor device 120' are illustrated, but not limited thereto) may be provided on the carrier 200 and within or between the through vias (if any). In an embodiment, the semiconductor package 100 may include one semiconductor device 120' as it is shown in FIG. 5. In other embodiment, the semiconductor package 100 may include more than one semiconductor devices as a set, and the through vias may surround the set of the semiconductor devices. In some embodiments, the semiconductor device 120' is electrically connected to the redistribution structure 110. In an embodiment, the semiconductor device 120' may be mounted on the redistribution structure 110 by, for example, a surface mount technique through a plurality of electrical terminals 123, such as conductive bumps, and a plurality of solder materials 126, although any suitable method of mounting may alternatively be utilized.

In some embodiments, the semiconductor device 120' may be a logic device die including logic circuits therein. In some exemplary embodiments, the semiconductor device 120' is a die that are designed for mobile applications, and may include a Power Management Integrated Circuit (PMIC) die and a Transceiver (TRX) die, for example. It is noted that more or less semiconductor device 120' may be placed over the redistribution structure 110 and level with one another.

In some exemplary embodiments, each of the semiconductor devices 120' may include a substrate 121, a plurality of active devices (not shown), and a plurality of contact pads 122. The contact pads 122 (such as copper pads) may be formed on an active surface (e.g. a lower surface) of the semiconductor device 120' and electrically coupled to the contact pads 122 on the substrate 121. The substrate 121 may include bulk silicon, doped or undoped, or an active layer of a silicon-on-insulator (SOI) substrate. Generally, an SOI substrate includes a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. In some embodiments, the semiconductor device 120' may be a die, which may contains a plurality of transistors and other active and passive devices performing a variety of electrical functions. The active devices may be formed using any suitable methods either within or else on the substrate 121.

In some embodiments, a material such as a polymer is then applied between the semiconductor device 120' and the redistribution structure 110 as an underfill 124. The underfill 124 is typically a polymer, for example, an epoxy. With the application of heat to the semiconductor device 120' and/or the redistribution structure 110, the underfill 124 may be made to flow between the semiconductor device 120' and the redistribution structure 110, using capillary action. When formed from a material such as a polymer epoxy, the underfill 124 is then typically cured, to harden the polymer. The cured underfill 124 surrounds the electrical terminals 123 and acts to protect the electrical terminals 123 and connection between the semiconductor device 120' and the redistribution structure 110, as well as to support the semiconductor device 120' on the redistribution structure 110.

With reference now to FIG. 5A, in some embodiments, the semiconductor device 120' and the through vias (if any) on the redistribution structure 110 are encapsulated by an encapsulating material 130'. In other words, the encapsulating material 130' is formed on the redistribution structure 110 to encapsulate the semiconductor device 120' and the through vias (if any). In some embodiments, the encapsulating material 130' is in contact with the redistribution structure 110. The encapsulating material 130' may include a molding compound resin such as polyimide, PPS, PEEK, PES, a heat resistant crystal resin, combinations of these, or the like. The encapsulation of the semiconductor device 120' and the through vias (if any) may be performed in a molding device (not shown). The encapsulating material 130' may be placed within a molding cavity of the molding device, or else may be injected into the molding cavity through an injection port.

Once the encapsulating material 130' has been placed into the molding cavity such that the encapsulating material 130' encapsulates the semiconductor device 120' and the through vias (if any), the encapsulating material 130' may be cured in order to harden the encapsulating material 130' for optimum protection. Additionally, initiators and/or catalysts may be included within the encapsulating material 130' to better control the curing process. In some embodiments, a top surface of the encapsulating material 130' may be higher than the back surface of the semiconductor device 120'. Namely, the encapsulating material 130' covers the back surface of the semiconductor device 120'.

With reference now to FIG. 5B, a thinning process may be performed on the encapsulating material 130' to reveal or thin the back surface of the semiconductor device 120'. The thinning process may be, for example, a mechanical grinding or CMP process whereby chemical etchants and abrasives are utilized to react and grind away the encapsulating material 130' and the semiconductor device 120'. The resulting structure is shown in FIG. 5B. After the thinning process is performed, the back surface of the semiconductor device 120 is substantially level with the upper surface of the encapsulating material 130 as shown in FIG. 5B. However, while the CMP process described above is presented as one illustrative embodiment, it is not intended to be limiting. Any other suitable removal process may alternatively be used to thin the encapsulating material 130 and the semiconductor device 120. For example, a series of chemical etches may alternatively be utilized. This process and any other suitable process may alternatively be utilized to thin the encapsulating material 130 and the semiconductor device 120, and all such processes are fully intended to be included within the scope of the embodiments.

Accordingly, the resultant structure including the semiconductor device 120, the through vias (if any) and the encapsulating material 130 as shown in FIG. 5B is referred to as encapsulated semiconductor device 125', which may have a wafer form in the process. Accordingly, in the encapsulated semiconductor device 125', the semiconductor device 120 are disposed on a die area of the redistribution structure 110, the through vias (if any) extend through the encapsulated semiconductor device 125' outside of the die area, and the encapsulating material 130 encapsulates the semiconductor device 120 and the through vias (if any). In other words, the encapsulating material 130 encapsulates the semiconductor device 120 therein, and the through vias (if any) extends through the encapsulating material 130.

With reference now to FIG. 6, alternatively, before the encapsulating material 130 is formed on the redistribution structure 110, a substrate 140 is mounted over the semiconductor device 120 through a plurality of conductive joints 142 disposed around the semiconductor device 120. In other words, in an alternative embodiment, the step illustrated in FIG. 6 is sequentially performed after the step illustrated in FIG. 5 instead of performing the steps illustrated in FIG. 5A and FIG. 5B. The substrate 140 may be mounted on the redistribution structure 110 by a surface mount technique. In some embodiments, the substrate 140 may be, e.g., a silicon substrate, doped or undoped, or an active layer of a silicon-on-insulator (SOI) substrate, and may be function as an interposer used as an intermediate substrate. However, the substrate 140 may alternatively be a glass substrate, a ceramic substrate, a polymer substrate, or any other substrate that may provide a suitable protection and/or interconnection functionality. These and any other suitable materials may alternatively be used for the substrate 140. In other embodiments, the substrate 140 may be a semiconductor device, a semiconductor package, a heat sink, or any combination thereof. The conductive joints 142 connected to the redistribution structure 110 can be, for example, solder balls formed by reflowing. However, copper pillars or gold studs can also be used as conductive joints 142 by reflowing with solder materials.

With reference now to FIG. 7, in the present embodiments, an encapsulating material 130 encapsulates the semiconductor device 120 and the conductive joints 142 and fills the gap between the semiconductor device 120 and the substrate 140. The encapsulating material 130 may include a molding compound resin such as polyimide, PPS, PEEK, PES, a heat resistant crystal resin, combinations of these, or the like. In some embodiments, the encapsulating material 130 may be an underfill, which is typically a polymer, for example, an epoxy.

Throughout the description, the resultant structure including the semiconductor device 120, the substrate 140, the conductive joints 142 and the encapsulating material 130 as shown in FIG. 7 is referred to as encapsulated semiconductor device 125, which may have a wafer form in the process. Accordingly, in the encapsulated semiconductor device 125, the semiconductor device 120 are mounted on the redistribution structure 110, the substrate 140 is mounted over the semiconductor device 120 through the conductive joints 142. The encapsulating material 130 encapsulates the semiconductor device 120 and the conductive joints 142 and fills the gap between the semiconductor device 120 and the substrate 140. The redistribution structure 110 is disposed over the encapsulated semiconductor device 125 and electrically connected to the semiconductor device 120. Throughout the description, the resultant structure including the encapsulated semiconductor device 125 and the redistribution structure 110 as shown in FIG. 7 is referred to as a reconstructed wafer.

In some embodiments, after the encapsulated semiconductor device 125 is formed on the redistribution structure 110, another carrier 300 may be disposed on the substrate 140. In other words, the carrier 300 and the carrier 200 are disposed respectively on two opposite sides of the reconstructed wafer. In some embodiments, the reconstructed wafer with the carrier 200 may be flipped over and disposed on the carrier 300 by attaching the substrate 140 to the carrier 300. The carrier 300 bearing the reconstructed wafer with the carrier 200 may further include a frame structure (not shown), which may be a metal ring intended to provide support and stability for the structure during and after the sequential de-bonding process. In some embodiments, the reconstructed wafer with the carrier 200 are attached to the frame structure using, e.g. an ultraviolet tape, although any other suitable adhesive or attachment may alternatively be used.

Figure 8:
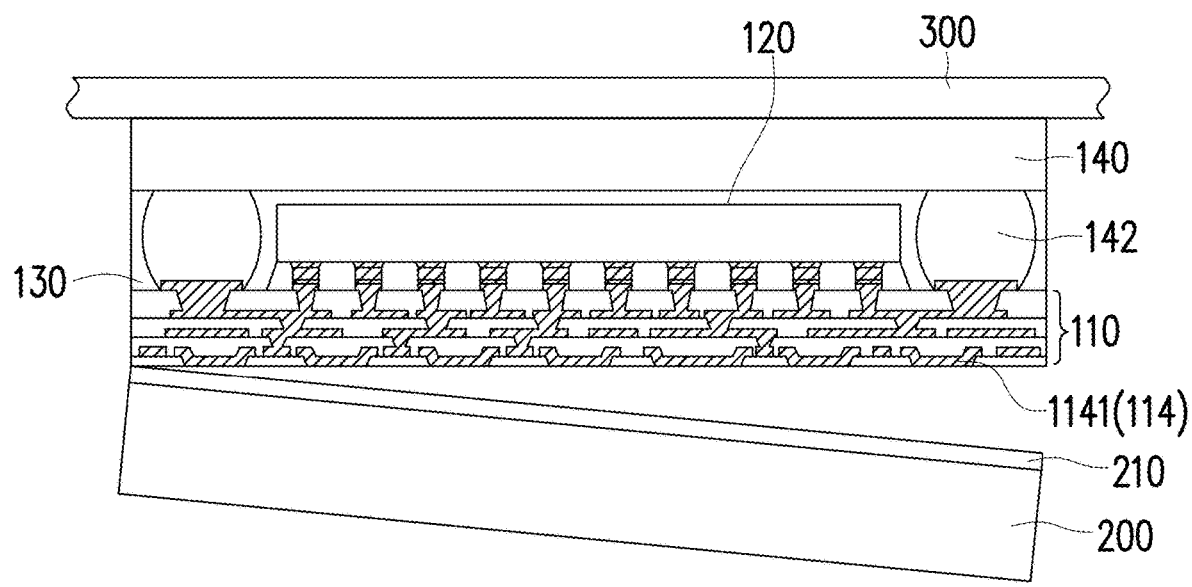

With reference now to FIG. 8, the carrier 200 is removed (e.g. de-bonded) from the reconstructed wafer on the carrier 300. The carrier 200 may be de-bonded using, for example, a thermal process to alter the adhesive properties of the adhesive layer 210. In an embodiment, an energy source such as an ultraviolet (UV) laser, a carbon dioxide (CO2) laser, or an infrared (IR) laser, is utilized to irradiate and heat the adhesive layer 210 until the adhesive layer 210 loses at least some of its adhesive properties. Once performed, the carrier 200 and the adhesive layer 210 may be physically separated and removed from the redistribution structure 110 of the reconstructed wafer as it is shown in FIG. 8.

After the carrier 200 is removed, a lower surface of the pad pattern 114 is revealed for sequential electrical connection. In some embodiments, the lower surface of the pad pattern 114 is substantially coplanar with a lower surface of the dielectric layer 112. In such embodiment, the lower surface of the pad pattern 114 is the lower surface of the pad portion 1141, and the lower surface of the dielectric layer 112 is the surface away from the encapsulated semiconductor device 125.

Figure 9:
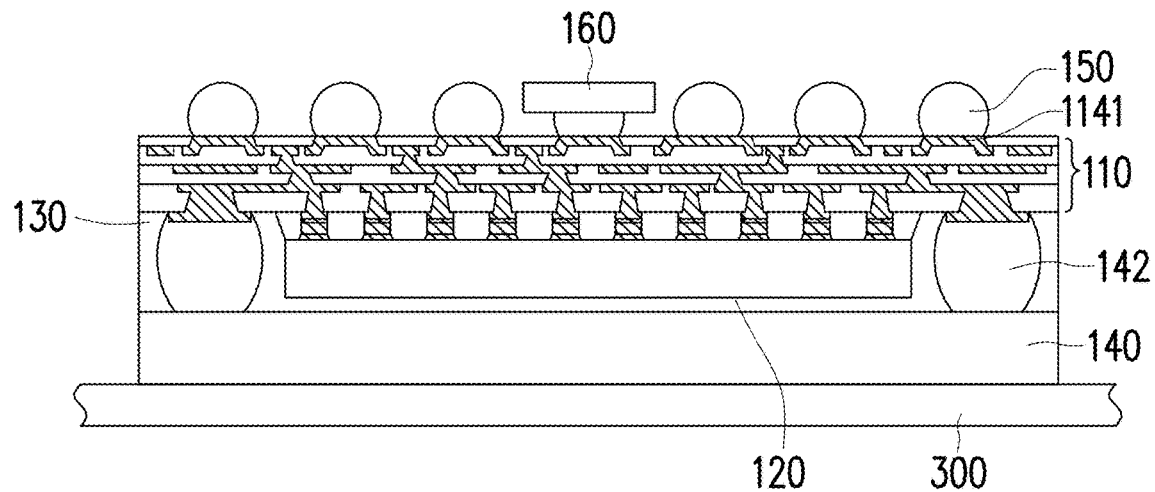

With reference now to FIG. 9, the resultant structure after the carrier 200 is removed may then be flipped over as it is shown in FIG. 9. Then, at least one electrical component, e.g. a plurality of electrical connectors 150 and/or at least one passive device 160, can be mounted on the lower surface of the pad portion 1141 (now facing up in FIG. 9). In some embodiments, the electrical connectors 150 includes a solder bump. In some embodiments, the electrical connectors 150 can further include a metal pillar. The passive device 160 can be an integrated passive device (IPD). In the present embodiments, the redistribution structure 110 includes a plurality of pad patterns 114. Some of the pad portions 1141 of the pad patterns 114 are mounted with the electrical connector 150, and at least one of the pad portions 1141 of the pad patterns 114 are mounted with the passive device 160. With such arrangement, the pad portions 1141 can be functioned as an under bump metallurgy (UBM) layer, so an additional UBM layer can be omitted. In some embodiments, the formation of the electrical connectors 150 may include placing solder balls on the pad portions 1141, and then reflowing the solder balls. In alternative embodiments, the formation of the electrical connectors 150 may include performing a plating process to form solder materials on the pad portions 1141, and then reflowing the plated solder materials. For example, the electrical connectors 150 may be contact bumps such as micro-bumps or controlled collapse chip connection (C4) bumps and may include a material such as tin, or other suitable materials, such as silver or copper. In an embodiment in which the electrical connectors 150 are tin solder bumps, the electrical connectors 150 may be formed by initially forming a layer of tin through any suitable method such as evaporation, electroplating, printing, solder transfer, ball placement, etc. Once a layer of tin has been formed on the structure, a reflow is performed in order to shape the material into the desired bump shape. In some embodiments, the electrical connectors 150 may be metal pillars, and the formation of the metal pillars may include plating using photoresist. The passive device 160 may be fabricated using standard wafer fabrication technologies such as thin film and photolithography processing, and may be mounted on the other pad portions 1141 through, for example, flip-chip bonding, etc.

Throughout the description, the resultant structure including the redistribution structure 110, the encapsulated semiconductor device 125, the substrate 140 (if any), and the electrical component 150/160 as shown in FIG. 9 is referred to as the semiconductor package, which may have a wafer form in the process.

Figure 10:
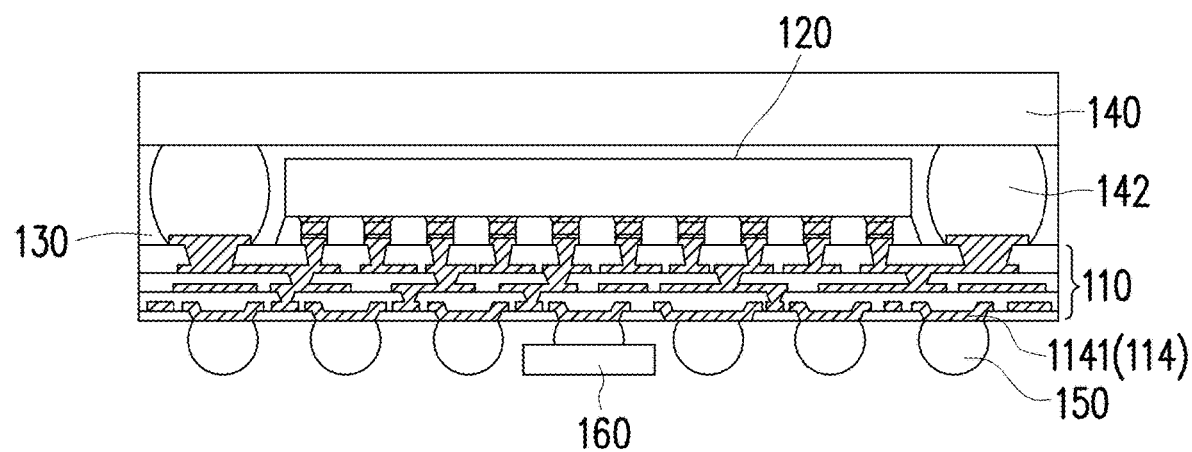

With reference now to FIG. 10, the carrier 300 is de-bonded from the substrate 140 of the semiconductor package. In an embodiment, the carrier 300 is de-bonded from substrate 140 by, for example, irradiating the ultraviolet adhesive on the carrier 300 with ultraviolet radiation and, once the ultraviolet adhesive has lost or reduce its adhesiveness, the substrate 140 may be physically separated from the carrier 300.

In some embodiments, the semiconductor package is in a wafer form in the process. Accordingly, once the carrier 300 is de-bonded, a singularizing process is performed on the semiconductor package in wafer form to form a plurality of semiconductor packages 100. In an embodiment, the singularizing process may be performed by using a saw blade (not shown) to slice through the semiconductor package in wafer form, thereby separating one section (e.g. include one semiconductor device 120 and one substrate 140) from another to form the semiconductor package 100 as shown in FIG. 10. However, as one of ordinary skill in the art will recognize, utilizing a saw blade to singulate the semiconductor packages 100 is merely one illustrative embodiment and is not intended to be limiting. Alternative methods for singulating the semiconductor packages 100, such as utilizing one or more etches to separate the semiconductor packages 100, may alternatively be utilized. These methods and any other suitable methods may alternatively be utilized to singulate the semiconductor packages 100. In the present embodiment, each of the semiconductor packages 100 may be an integrated fan-out package.

Accordingly, by forming the pad pattern 114 of the redistribution structure 110 of the semiconductor package 100 with the holes 1143 as described herein, a more reliable device may be obtained. In particular, by forming the holes 1143 as described in any of the embodiments herein, stress on sidewall of the pad pattern 114 during thermal cycling of testing, manufacturing, and operating processes can be reduced or less concentrated. As such, delamination, peeling, and cracking that may otherwise be caused by these stresses may be reduced or eliminated, allowing for larger yields and more reliable devices.

Figure 13:
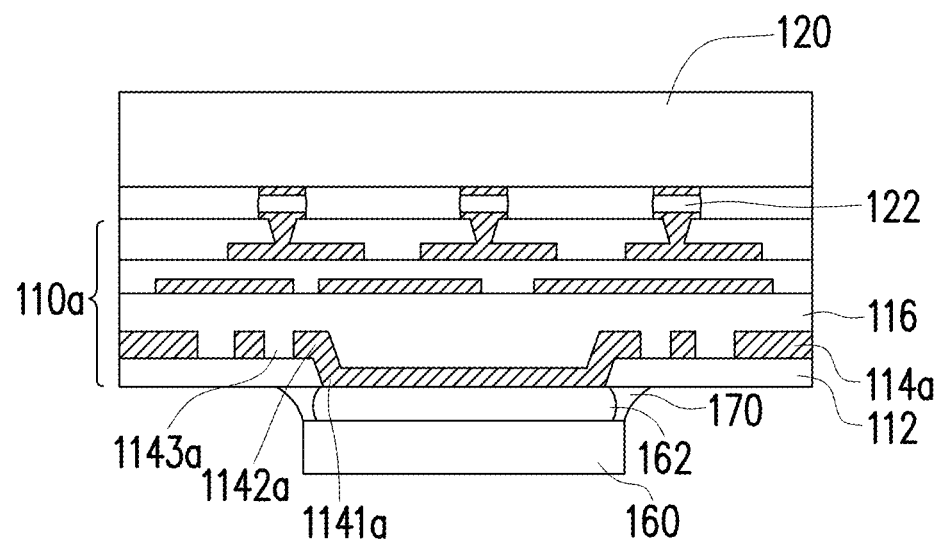
FIG. 13 illustrates a cross sectional view of a semiconductor package according to some exemplary embodiments of the present disclosure.
Figure 14:
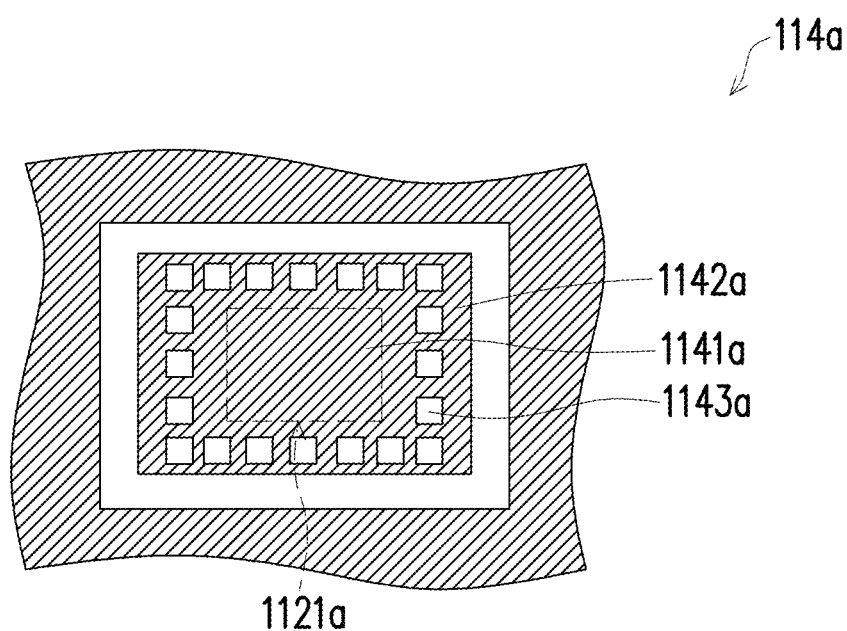
FIG. 14 illustrates a top view of a pad pattern of the semiconductor package in FIG. 13.

FIG. 13 illustrates a cross sectional view of a semiconductor package according to some exemplary embodiments of the present disclosure. FIG. 14 illustrates a top view of a pad pattern of the semiconductor package in FIG. 13. It is noted that the pad pattern 114a of the semiconductor package 100a shown in FIG. 13 and FIG. 14 contains many features same as or similar to the pad pattern 114 of the semiconductor package 100 disclosed earlier with reference to FIG. 2, FIG. 11 and FIG. 12. For purpose of clarity and simplicity, detail description of same or similar features may be omitted, and the same or similar reference numbers denote the same or like components. The main differences between the pad pattern 114a of the semiconductor package 100a shown in FIG. 13 and FIG. 14 and the pad pattern 114 of the semiconductor package 100 shown in FIG. 2, FIG. 11 and FIG. 12 are described as follows.

In some embodiments, the pad pattern 114a is in a rectangular shape. For example, the pad portion 1141a and peripheral portion 1142a of the pad pattern 114a are both in rectangular shapes. In addition, each of the holes 1143a can be rectangular as shown in FIG. 14. In some alternative embodiments, the holes 1143a can be of a different shape. Accordingly, the pad opening 1121 is a rectangular opening, and the rectangular pad portion 1141a extended into the rectangular pad opening 1121 to be coplanar with a lower surface of the dielectric layer 112. The holes 1143a surround the rectangular pad portion 1141a and are located within the peripheral portion 1142a. In such embodiment, the passive device 160 may be directly mounted on the rectangular pad portion 1141a through a solder material 162. It is noted that the pad portion 1141a and peripheral portion 1142a are both in rectangular shapes in the present embodiment. However, in other embodiments, the pad portion 1141a and peripheral portion 1142a may also be in square, rectangle, circle, ellipse, triangle or irregular shapes. The disclosure is not limited thereto. In some embodiments, the semiconductor package 100a may further include an underfill 170, which may surround the solder material 162 and fill the gap between the passive device 160 and the redistribution structure 110a to enhance the bonding strength, redistribute thermal mismatch loading, and protect the solder connections.

Figure 15:
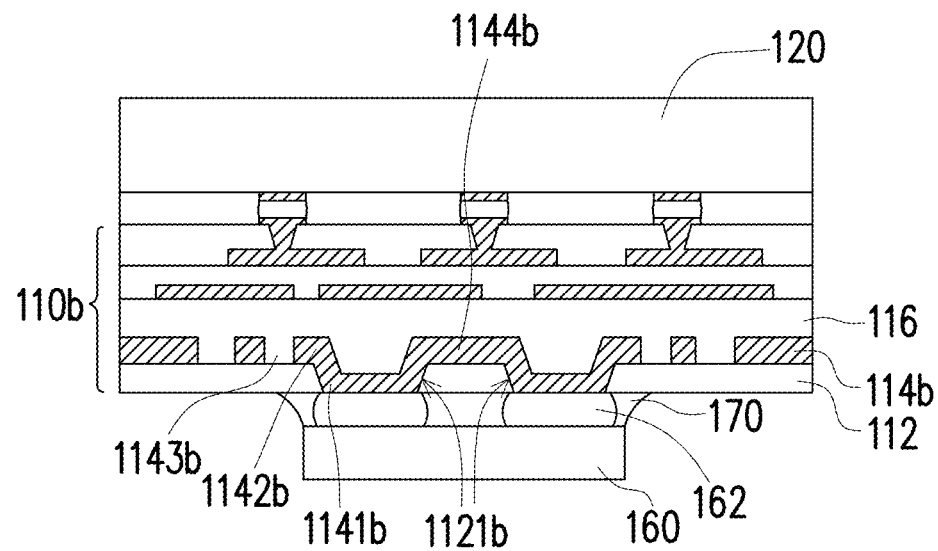
FIG. 15 illustrates a cross sectional view of a semiconductor package according to some exemplary embodiments of the present disclosure.
Figure 16:
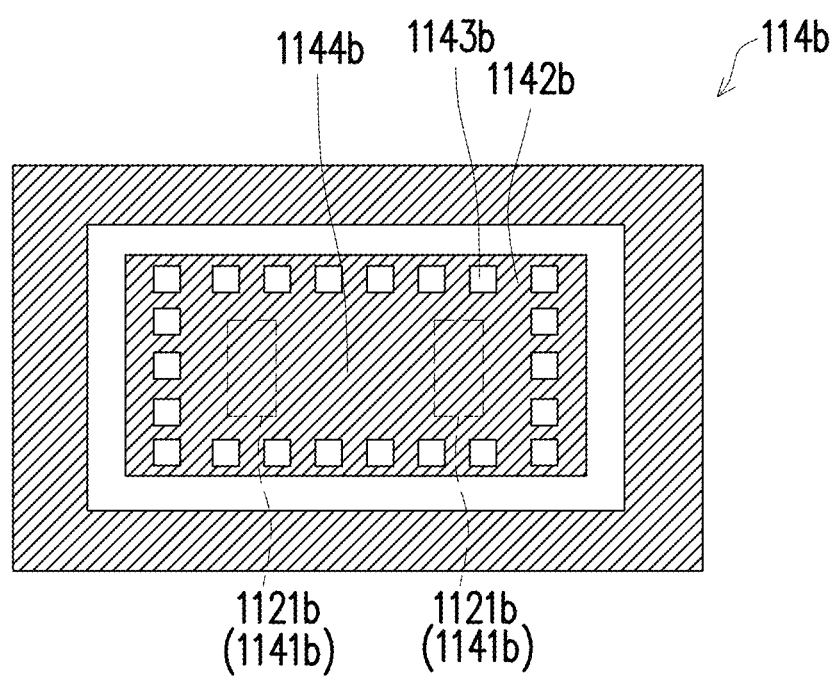
FIG. 16 illustrates a top view of a pad pattern of the semiconductor package in FIG. 15.

FIG. 15 illustrates a cross sectional view of a semiconductor package according to some exemplary embodiments of the present disclosure. FIG. 16 illustrates a top view of a pad pattern of the semiconductor package in FIG. 15. It is noted that the pad pattern 114b of the semiconductor package 100b shown in FIG. 15 and FIG. 16 contains many features same as or similar to the pad pattern 114a of the semiconductor package 100a disclosed earlier with FIG. 13 and FIG. 14. For purpose of clarity and simplicity, detailed description of same or similar features may be omitted, and the same or similar reference numbers denote the same or like components. The main differences between the pad pattern 114b of the semiconductor package 100b shown in FIG. 15 and FIG. 16 and the pad pattern 114a of the semiconductor package 100a shown in FIG. 13 and FIG. 14 are described as follows.

In some embodiments, the at least one pad portion mentioned above may include a plurality of pad portions 1141b, which are embedded in the first dielectric layer 112b. Namely, the pad pattern 114b include a plurality of (rectangular) pad portions 1141b, and the dielectric layer 112b includes a plurality of (rectangular) pad openings 1121b. The pad portions 1141b extend into the pad openings 1121b respectively, and the (rectangular) holes 1143b (i.e. the dielectric plugs/the extending portions) surround a periphery of the pad portions 1141b. In the present embodiment, there is no hole 1143b disposed between any two adjacent pad portions 1141b to separate the pad portions 1141b. In other words, the pad pattern 114b further include at least one connecting portion 1144b disposed on the upper surface of the dielectric layer 112b. The connecting portion 1144b connects any two adjacent pad portions 1141b extending into the pad opening 1121b the pad portions 1141b. As such, the pad portions 1141b are connected to one another through the connecting portion 1144b and form a continuous metal block. In such embodiment, the passive device 160 may be mounted on the pad portions 1141b through solder materials 162. In some embodiments, the semiconductor package 100b may further include an underfill 170 surrounding the solder material 162 and filling the gap between the passive device 160 and the redistribution structure 110b to enhance the bonding strength, redistribute thermal mismatch loading, and protect the solder connections.

Figure 17:
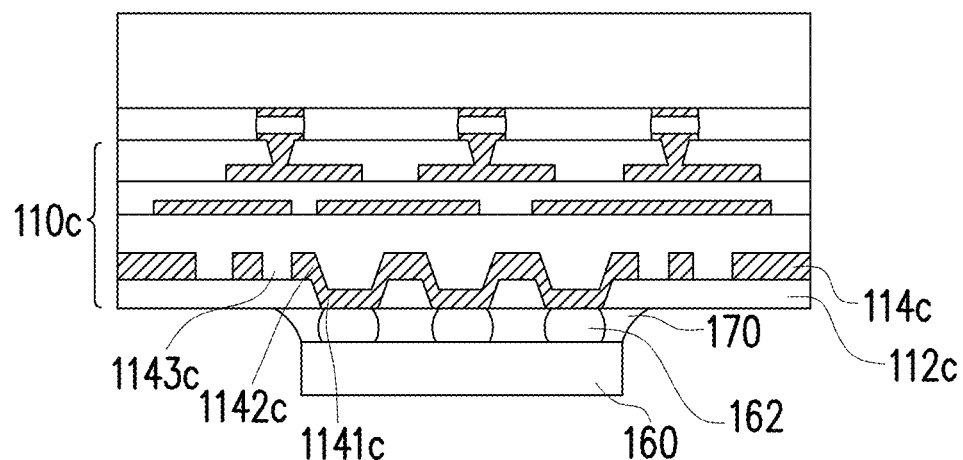
FIG. 17 illustrates a cross sectional view of a semiconductor package according to some exemplary embodiments of the present disclosure.
Figure 18:
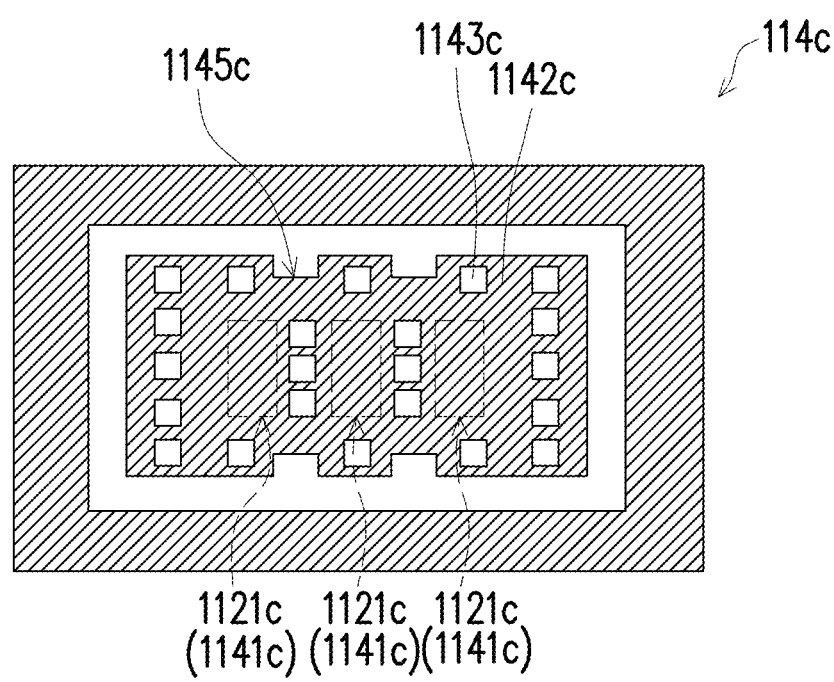
FIG. 18 illustrates a top view of a pad pattern of the semiconductor package in FIG. 17.

FIG. 17 illustrates a cross sectional view of a semiconductor package according to some exemplary embodiments of the present disclosure. FIG. 18 illustrates a top view of a pad pattern of the semiconductor package in FIG. 17. It is noted that the pad pattern 114c of the semiconductor package 100c shown in FIG. 17 and FIG. 18 contains many features same as or similar to the pad pattern 114a of the semiconductor package 100a disclosed earlier with FIG. 13 and FIG. 14. For purpose of clarity and simplicity, detailed description of same or similar features may be omitted, and the same or similar reference numbers denote the same or like components. The main differences between the pad pattern 114c of the semiconductor package 100c shown in FIG. 17 and FIG. 18 and the pad pattern 114a of the semiconductor package 100a shown in FIG. 13 and FIG. 14 are described as follows.

In some embodiments, the at least one pad portion mentioned above may include a plurality of pad portions 1141c, which are embedded in the first dielectric layer 112c. Namely, the pad pattern 114c include a plurality of (rectangular) pad portions 1141c (three are illustrated but not limited thereto), and the dielectric layer 112c includes a plurality of (rectangular) pad openings 1121c (three are illustrated but not limited thereto). The pad portions 1141c extend into the pad openings 1121c respectively, and the (rectangular) holes 1143c (i.e. the dielectric plugs/the extending portions) surround each of the pad portions 1141c. In the present embodiment, some of the holes 1143c are disposed between two adjacent pad portions 1141c to separate the pad portions 1141c from one another. In other words, the peripheral portion 1142c surrounds each of the pad portions 1141c, such that the holes 1143c extending through the peripheral portion 1142c surround each of the pad portions 1141c accordingly. In addition, the peripheral portion 1142c may further include a plurality of cut-outs 1145c disposed along an edge of the peripheral portion 1142c and located between any two adjacent pad portions 1141c. In such embodiment, the passive device 160 may be mounted on the pad portions 1141c through solder materials 162. In some embodiments, the semiconductor package 100c may further include an underfill 170, which may surround the solder material 162 and fill the gap between the passive device 160 and the redistribution structure 110c to enhance the bonding strength, redistribute thermal mismatch loading, and protect the solder connections.

Figure 19:
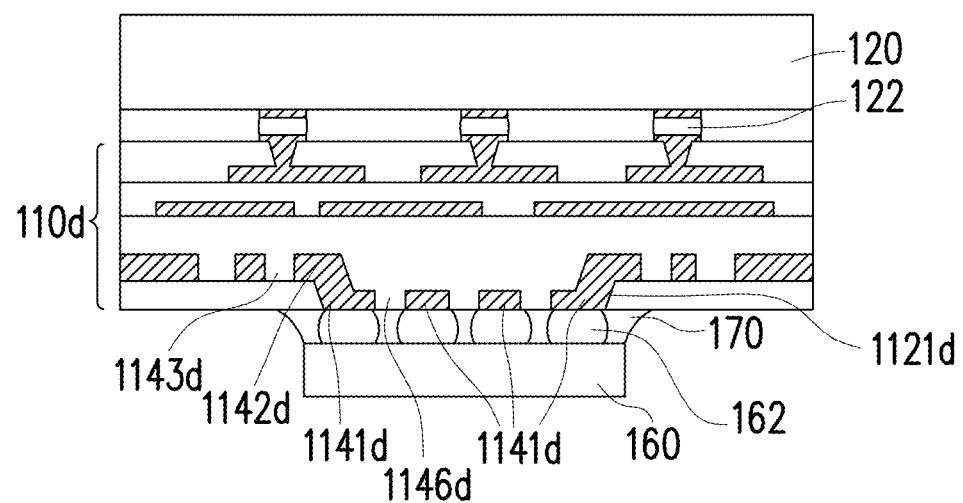
FIG. 19 illustrates a cross sectional view of a semiconductor package according to some exemplary embodiments of the present disclosure.
Figure 20:
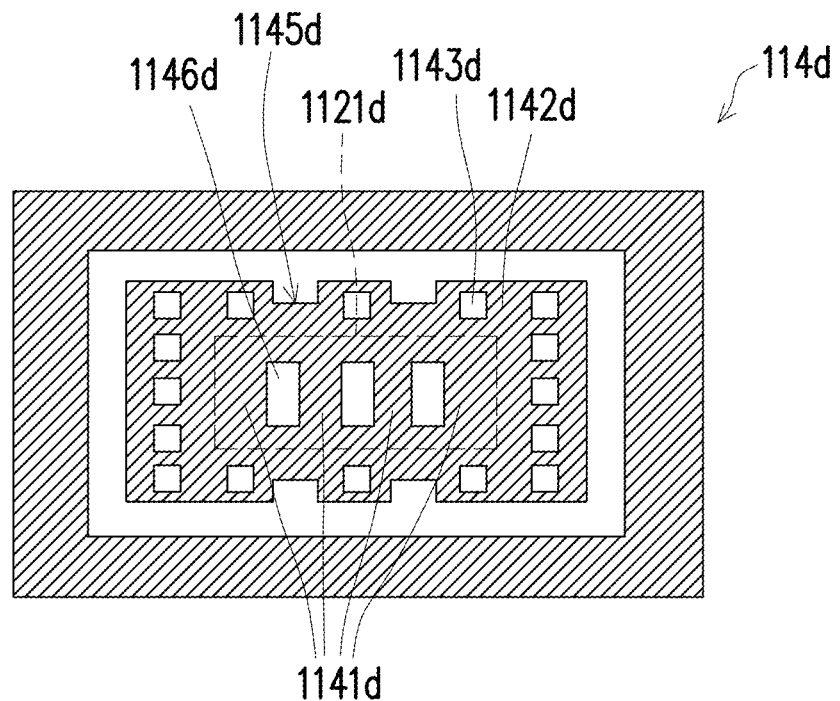
FIG. 20 illustrates a top view of a pad pattern of the semiconductor package in FIG. 19.

FIG. 19 illustrates a cross sectional view of a semiconductor package according to some exemplary embodiments of the present disclosure. FIG. 20 illustrates a top view of a pad pattern of the semiconductor package in FIG. 19. It is noted that the pad pattern 114d of the semiconductor package 100d shown in FIG. 19 and FIG. 20 contains many features same as or similar to the pad pattern 114a of the semiconductor package 100a disclosed earlier with FIG. 13 and FIG. 14. For purpose of clarity and simplicity, detailed description of same or similar features may be omitted, and the same or similar reference numbers denote the same or like components. The main differences between the pad pattern 114d of the semiconductor package 100d shown in FIG. 19 and FIG. 20 and the pad pattern 114a of the semiconductor package 100a shown in FIG. 13 and FIG. 14 are described as follows.

In some embodiments, the (rectangular) pad portion 1141d further include a plurality of pad recesses 1146d (three are illustrated but not limited thereto) extending through the pad portion 1141d and disposed in the (rectangular) pad opening 1121d. The holes 1143d surround a periphery of the pad portion 1141d. The pad portion 1141d extends into the pad opening 1121d and is divided into a plurality of connecting sections by the pad recesses 1146d. The (rectangular) holes 1143c surround the periphery of the pad portion 1141d in the present embodiment. In addition, the peripheral portion 1142d may further include a plurality of cut-outs 1145d disposed along an edge of the peripheral portion 1142d and located corresponding to the pad recesses 1146d. In such embodiment, the passive device 160 may be mounted on the connecting sections of the pad portion 1141c defined by the pad recesses 1146d. In some embodiments, the semiconductor package 100d may further include an underfill 170, which may surround the solder material 162 and fill the gap between the passive device 160 and the redistribution structure 110d to enhance the bonding strength, redistribute thermal mismatch loading, and protect the solder connections.

By forming the pad patterns with the holes in different arrangements as described herein but not limited thereto, various proportions of volumes of the holes to the volumes of the pad patterns can be designed or modified according to actual requirement of products. Thereby, a more reliable device may be obtained. In particular, by forming the holes as described in any of the embodiments herein, the stress on the sidewall of the pad pattern during thermal cycling of testing, manufacturing, and operating processes can be reduced or less concentrated. As such, delamination, peeling, and cracking that may otherwise be caused by these stresses may be reduced or eliminated, allowing for larger yields and more reliable devices. In addition, electronic devices can be mounted on the pad portion without forming any UBM layers.

Based on the above discussions, it can be seen that the present disclosure offers various advantages. It is understood, however, that not all advantages are necessarily discussed herein, other embodiments may offer different advantages, and that no particular advantage is required for all embodiments.

In accordance with some embodiments of the disclosure, a device includes a first dielectric layer, a pad pattern, and a second dielectric layer. The pad pattern is disposed on the first dielectric layer and includes a pad portion and a peripheral portion. The pad portion is embedded in the first dielectric layer, wherein a lower surface of the pad portion is substantially coplanar with a lower surface of the first dielectric layer. The peripheral portion surrounds the pad portion. The second dielectric layer is disposed on the pad pattern and includes a plurality of extending portions extending through the peripheral portion.

In accordance with some embodiments of the disclosure, a semiconductor package includes an encapsulated semiconductor device and a redistribution structure. The encapsulated semiconductor device includes a semiconductor device encapsulated by an encapsulating material. The redistribution structure is extended over the encapsulated semiconductor device and electrically connected to the semiconductor device. The redistribution structure includes a dielectric layer, a pad pattern, and a plurality of dielectric plugs. The pad pattern is disposed on the dielectric layer, wherein pad pattern includes at least one pad portion embedded in the dielectric layer, and a lower surface of the pad pattern is substantially coplanar with a lower surface of the dielectric layer away from the encapsulated semiconductor device. The plurality of dielectric plugs extend through the pad pattern and surround the pad portion.

In accordance with some embodiments of the disclosure, a method of manufacturing a semiconductor package includes the following steps. A redistribution structure is formed on a carrier, wherein forming the redistribution structure on the carrier includes the following steps: forming a first dielectric layer on the carrier, wherein the first dielectric layer comprises a pad opening; forming a pad pattern on the first dielectric layer, wherein the pad pattern extends into the pad opening and comprises a plurality of holes; and forming a second dielectric layer on the pad pattern, wherein the second dielectric layer fills the holes. An encapsulated semiconductor device is formed on the redistribution structure. The carrier is removed to reveal a lower surface of the pad pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   a first dielectric layer;
   a pad pattern disposed on the first dielectric layer and comprising:
      at least one downset portion penetrating through the first dielectric layer, wherein a surface of the at least one downset portion substantially levels with a lower surface of the first dielectric layer, wherein the pad pattern further comprises a plurality of pad recesses extending through the at least one downset portion; and
      a peripheral portion laterally extending from the at least one downset portion to an upper surface of the first dielectric layer, and the upper surface of the first dielectric layer being opposite to the lower surface of the first dielectric layer;
   a second dielectric layer disposed on the upper surface of the first dielectric layer to cover the pad pattern, wherein the second dielectric layer penetrates through the peripheral portion and is in contact with the upper surface of the first dielectric layer, and the plurality of pad recesses are filled by the second dielectric layer; and
   a connector bump disposed on the surface of the at least one downset portion.

2. The structure as claimed in claim 1, wherein the at least one downset portion and the peripheral portion are integrally formed.

3. The structure as claimed in claim 1, wherein the pad pattern comprises holes distributed in the peripheral portion, and a sum of layout areas of the holes is substantially 3% to 60% of a sum of layout areas of the at least one downset portion and the peripheral portion.

4. The structure as claimed in claim 1, wherein the second dielectric layer comprising a plurality of extending portions, the plurality of extending portions penetrate through the peripheral portion, the plurality of extending portions are is in contact with the upper surface of the first dielectric layer, and the plurality of extending portions surround a periphery of the at least one downset portion.

5. The structure as claimed in claim 1, wherein the at least one downset portion comprises a plurality of downset portions separated from each other, and the peripheral portion surrounds the plurality of downset portions.

6. The structure as claimed in claim 1, wherein the plurality of pad recesses are filled by portions of the second dielectric layer, and the lower surface of the first dielectric layer substantially levels with lower surfaces of the portions of the second dielectric layer.

7. The structure as claimed in claim 1, wherein the peripheral portion comprises a plurality of cut-outs disposed along an edge of the peripheral portion.

8. A semiconductor package, comprising:
   an encapsulated semiconductor device;
   a redistribution structure disposed on and electrically connected to the encapsulated semiconductor device, the redistribution structure comprising:
      a first dielectric layer;
      a pad pattern disposed on the first dielectric layer, wherein the pad pattern comprises at least one downset portion embedded in the first dielectric layer, and a surface of the downset pattern substantially levels with a lower surface of the first dielectric layer away from the encapsulated semiconductor device, wherein the pad pattern further comprises a plurality of pad recesses extending through the at least one downset portion; a second dielectric layer disposed on an upper surface of the first dielectric layer to cover the pad pattern, wherein the second dielectric layer penetrates through the peripheral portion and is in contact with the upper surface of the first dielectric layer, and the plurality of pad recesses are filled by the second dielectric layer; and
      a plurality of dielectric plugs penetrating through the pad pattern and surrounding the at least one downset portion; and
   a connector bump disposed on the surface of the downset pattern.

9. The semiconductor package as claimed in claim 8, wherein the pad pattern further comprises a peripheral portion surrounding the at least one downset portion, and the plurality of dielectric plugs penetrate through the peripheral portion.

10. The semiconductor package as claimed in claim 9, wherein the peripheral portion is disposed on the upper surface of the first dielectric layer, the upper surface of the first dielectric layer is opposite to the lower surface of the first dielectric layer, and the at least one downset portion extends from the upper surface of the dielectric layer to the lower surface of the dielectric layer.

11. The semiconductor package as claimed in claim 9, wherein the at least one downset portion comprises a plurality of downset portions separated from each other, and the plurality of dielectric plugs surround a periphery of the plurality of downset portions.

12. The semiconductor package as claimed in claim 9, wherein the peripheral portion comprises a plurality of cut-outs disposed along an edge of the peripheral portion.

13. The semiconductor package as claimed in claim 9, wherein the pad pattern comprises holes for accommodating the plurality of dielectric plugs, and a sum of layout areas of the holes is substantially 3% to 60% of a sum of layout areas of the at least one downset portion and the peripheral portion.

14. The semiconductor package as claimed in claim 8, wherein the encapsulated semiconductor device comprising:
   a semiconductor device encapsulated by an encapsulating material;
   a plurality of conductive joints disposed around the semiconductor device; and
   a substrate disposed over and connected to the semiconductor device through the conductive joints, wherein the encapsulating material encapsulates the conductive joints.

15. A structure, comprising:
   a first dielectric layer;
   a second dielectric layer stacked over the first dielectric layer, the second dielectric layer comprising dielectric posts;
   a pad pattern comprising a downset portion embedded in the first dielectric layer and a peripheral portion surrounding the downset portion, wherein the downset portion of the pad pattern penetrates through the first dielectric layer, a plurality of pad recesses of the pad pattern extend through the at least one downset portion, the plurality of pad recesses are filled by the second dielectric layer, the peripheral portion of the pad pattern is sandwiched between the first dielectric layer and the second dielectric layer, the dielectric posts of the second dielectric layer penetrate through the peripheral portion and are in contact with the first dielectric layer, and a surface of the downset portion substantially levels with a surface of the first dielectric layer; and a connector bump disposed on the surface of the downset portion.

16. The structure as claimed in claim 15, wherein the connector bump and the second dielectric layer are disposed on opposite sides of the first dielectric layer.

17. The structure as claimed in claim 15, wherein the downset portion comprises a first portion and a second portion, the first portion comprises the surface substantially leveling with a surface of the first dielectric layer, the second portion extending from the first portion to the peripheral portion.

18. The structure as claimed in claim 17, wherein the second dielectric layer comprises a protruding portion in contact with the first and second portions of the downset portion, and the second portion of the downset portion is sandwiched between the first dielectric layer and the protruding portion of the second dielectric layer.

19. The structure as claimed in claim 15, wherein the second dielectric layer comprises a protruding portion in contact with the downset portion, and the protruding portion protrudes toward the connector bump.

20. The structure as claimed in claim 15, wherein the peripheral portion comprises a plurality of cut-outs disposed along an edge of the peripheral portion.

* * * * *